United States Patent
Lee et al.

(10) Patent No.: US 10,600,852 B2
(45) Date of Patent: Mar. 24, 2020

(54) ORGANIC LIGHT-EMITTING DISPLAY APPARATUS AND METHOD OF MANUFACTURING THE SAME

(71) Applicant: Samsung Display Co., Ltd., Yongin-Si, Gyeonggi-Do (KR)

(72) Inventors: Jungkyu Lee, Yongin-si (KR); Taehyun Kim, Yongin-si (KR); Seungmin Lee, Yongin-si (KR); Sangho Park, Yongin-si (KR); Joosun Yoon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/222,979

(22) Filed: Dec. 17, 2018

(65) Prior Publication Data

US 2019/0140034 A1  May 9, 2019

Related U.S. Application Data

(62) Division of application No. 15/449,532, filed on Mar. 3, 2017, now Pat. No. 10,186,560.

(30) Foreign Application Priority Data

Mar. 4, 2016 (KR) .................. 10-2016-0026421

(51) Int. Cl.
*H01L 29/08* (2006.01)
*H01L 27/32* (2006.01)
*H01L 51/52* (2006.01)

(52) U.S. Cl.
CPC ...... *H01L 27/3246* (2013.01); *H01L 27/3216* (2013.01); *H01L 27/3276* (2013.01); *H01L 51/5253* (2013.01); *H01L 51/525* (2013.01); *H01L 2227/323* (2013.01)

(58) Field of Classification Search
CPC ............. H01L 27/3246; H01L 27/3216; H01L 27/3276; H01L 51/5253; H01L 2227/323
See application file for complete search history.

(56) References Cited

U.S. PATENT DOCUMENTS

2009/0189517 A1  7/2009  Choi et al.
2012/0049169 A1  3/2012  Kim
(Continued)

*Primary Examiner* — Stephen M Bradley
*Assistant Examiner* — Wasiul Haider
(74) *Attorney, Agent, or Firm* — Innovation Counsel LLP

(57) ABSTRACT

Provided are an organic light-emitting display apparatus and a method of manufacturing the same. The organic light-emitting display apparatus includes: a substrate on which a display area is defined, wherein an image is displayed on the display area; a thin film transistor arranged on the display area of the substrate; a via-insulating layer covering the thin film transistor; a pixel electrode arranged on the via-insulating layer and electrically connected to the thin film transistor; a pixel-defining layer including an opening exposing a central portion of the pixel electrode, and covering an edge of the pixel electrode; a counter electrode facing the pixel electrode; an organic emission layer arranged between the pixel electrode and the counter electrode; a wire arranged on the via-insulating layer to be spaced apart from the pixel electrode and including a spacer area and a non-spacer area; and a spacer arranged on the spacer area.

6 Claims, 11 Drawing Sheets

(56) References Cited

U.S. PATENT DOCUMENTS

| | | | |
|---|---|---|---|
| 2014/0145155 A1* | 5/2014 | Park | H01L 51/5253 257/40 |
| 2014/0183479 A1* | 7/2014 | Park | H01L 51/56 257/40 |
| 2015/0001482 A1* | 1/2015 | Jung | H01L 27/323 257/40 |
| 2015/0200239 A1* | 7/2015 | Jung | H01L 27/3276 257/40 |
| 2015/0340414 A1* | 11/2015 | Choi | H01L 27/3246 257/40 |
| 2016/0233247 A1* | 8/2016 | Bai | H01L 27/124 |
| 2016/0351636 A1* | 12/2016 | Lee | H01L 51/5212 |
| 2017/0010712 A1 | 1/2017 | Yoshizumi et al. | |
| 2017/0154934 A1 | 6/2017 | Kim et al. | |

* cited by examiner

ORGANIC LIGHT-EMITTING DISPLAY APPARATUS AND METHOD OF MANUFACTURING THE SAME

CROSS-REFERENCE TO RELATED APPLICATION

This application is a divisional application of U.S. patent application Ser. No. 15/449,532 filed on Mar. 3, 2017, which claims priority under 35 U.S.C. § 119 of Korean Patent Application No. 10-2016-0026421, filed on Mar. 4, 2016, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Art

Organic light-emitting display apparatuses are self-emitting type display apparatuses that include an organic light-emitting device (OLED) including a hole injection electrode, an electron injection electrode, and an organic emission layer between the hole injection electrode and electron injection electrode, wherein excitons, which are generated by holes injected from the hole injection electrode and electrons injected from the electron injection electrode being united in the organic emission layer, emit light by falling from an excited state to a ground state.

Organic light-emitting display apparatuses are self-emitting type display apparatuses requiring no additional light sources, and thus, they may be driven by a low voltage, and may be formed to be thin and lightweight. Also, organic light-emitting display apparatuses have excellent characteristics, such as wide viewing angles, high contrast, and rapid response rates, all of which have drawn attention as next generation display apparatuses.

SUMMARY

One or more embodiments include an organic light-emitting display apparatus realizing high quality display at low expense, and a method of manufacturing the same.

Additional aspects will be set forth in part in the description which follows and, in part, will be apparent from the description, or may be learned by practice of the presented embodiments.

According to one or more embodiments, an organic light-emitting display apparatus includes: a substrate on which a display area is defined, wherein the display area is configured to display an image; a thin film transistor arranged on the display area of the substrate; a via-insulating layer covering the thin film transistor; a pixel electrode arranged on the via-insulating layer and electrically connected to the thin film transistor; a pixel-defining layer including an opening exposing a central portion of the pixel electrode, and covering an edge of the pixel electrode; a counter electrode facing the pixel electrode; an organic emission layer arranged between the pixel electrode and the counter electrode; a wire arranged on the via-insulating layer to be spaced apart from the pixel electrode and including a spacer area and a non-spacer area; and a spacer arranged on the spacer area.

The spacer area may have a greater width than the non-spacer area.

The spacer may be arranged on a same layer as the pixel-defining layer.

A height of the spacer may be greater than a height of the pixel-defining layer.

The spacer may include a same material as the pixel-defining layer.

The spacer may completely cover the spacer area, and an end of the spacer area may be arranged between the via-insulating layer and the spacer.

The wire may include a contact hole, and the contact hole may be spaced apart from the spacer area.

The organic light-emitting display apparatus may further include a wire-protection layer completely covering the non-spacer area of the wire and patterned to correspond to the non-spacer area.

A height of the spacer may be greater than a height of the wire-protection layer, and the spacer may be connected to the wire-protection layer and may include a same material as the wire-protection layer.

The pixel-defining layer may include a first inclination portion extending from an area where an upper surface of the pixel electrode contacts the opening, and a second inclination portion extending from the first inclination portion to an area of an upper surface of the via-insulating layer in a different inclination direction from the first inclination portion.

A first angle between the pixel electrode and the first inclination portion may be greater than a second angle between the via-insulating layer and the second inclination portion.

The organic light-emitting display apparatus may further include a thin film encapsulation layer arranged on the counter electrode and including at least one inorganic layer and at least one organic layer.

The pixel-defining layer may include a photo-sensitive organic material.

According to one or more embodiments, a method of manufacturing an organic light-emitting display apparatus includes: providing a substrate on which a display area is defined, wherein the display area is configured to display an image; forming a thin film transistor on the display area of the substrate; forming a via-insulating layer covering the thin film transistor; forming a conductive material on the via-insulating layer; forming a second insulating material on the conductive material; exposing the conductive material by irradiating light onto the second insulating material and removing a portion of the second insulating material; forming a pixel electrode and a wire that is spaced apart from the pixel electrode by etching an exposed portion of the conductive material; forming a pixel-defining layer covering an edge area of the pixel electrode, and a spacer covering the wire, by reflowing the second insulating material; forming an organic emission layer on the pixel electrode; and forming a counter electrode on the organic emission layer.

The wire may include a spacer area on which the spacer is formed, and a non-spacer area, and the spacer area may have a greater width than the non-spacer area.

A height of the spacer may be greater than a height of the pixel-defining layer.

The wire may include a contact hole, and the contact hole may be spaced apart from the spacer area.

The method may further include forming a wire-protection layer completely covering the non-spacer area of the wire and patterned to correspond to the non-spacer area.

The method may further include irradiating light onto the second insulating material, wherein the irradiating light onto the second insulating material includes irradiating light onto the second insulating material by using a half-tone mask including a transmissive portion, a semi-transmissive portion, and a light shielding portion.

The method may further include, after forming the counter electrode, forming a thin film encapsulation layer including at least one inorganic layer and at least one organic layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
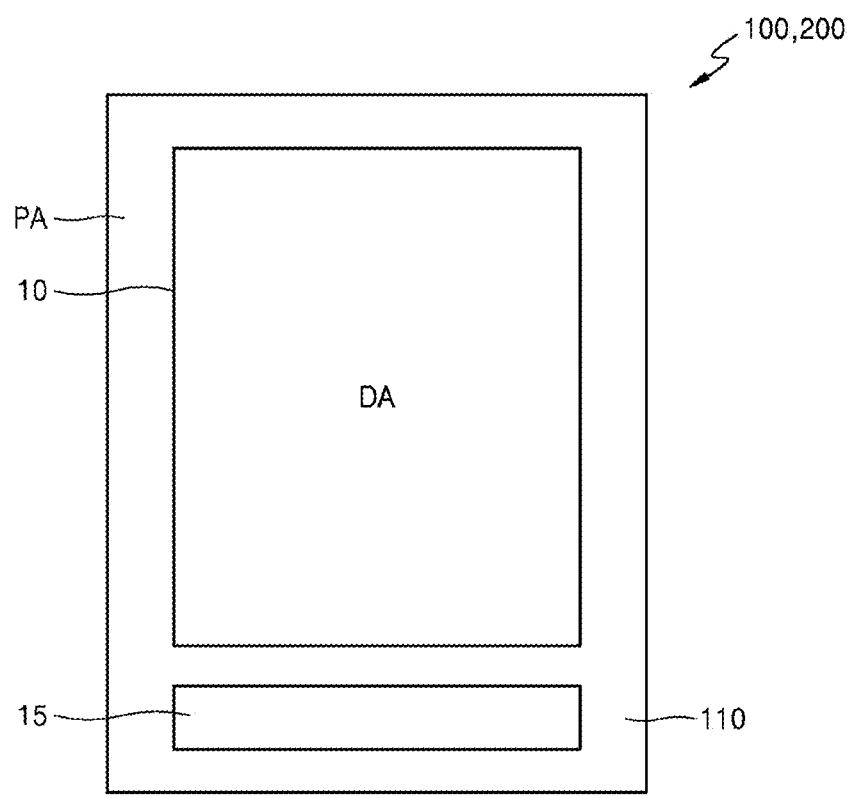
FIG. 1A is a schematic plan view of an organic light-emitting display apparatus according to an embodiment.

The present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Reference will now be made in detail to embodiments, examples of which are illustrated in the accompanying drawings, wherein like reference numerals refer to like elements throughout, and repeated descriptions will not be made.

Figure 1B:
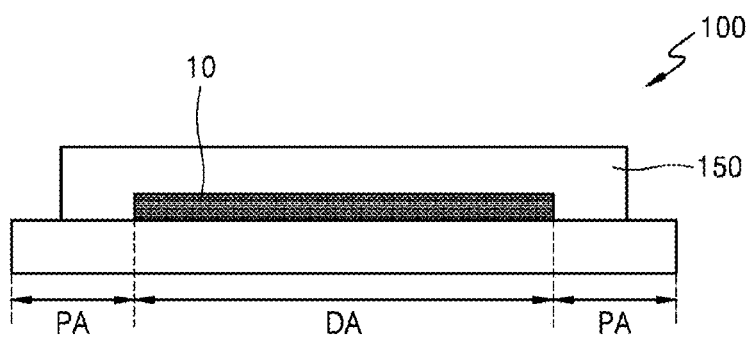
FIGS. 1B and 1C are cross-sectional views schematically showing a structure of an organic light-emitting display apparatus according to an embodiment.
Figure 1C:
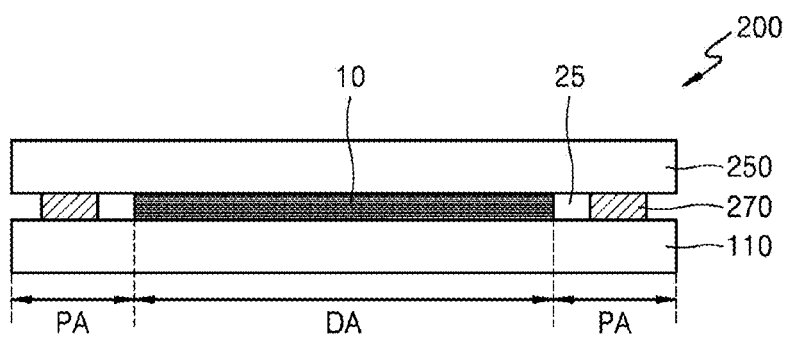

FIG. 1A is a schematic plan view of organic light-emitting display apparatuses 100 and 200 according to embodiments. FIGS. 1B and 1C are cross-sectional views schematically showing structures of the organic light-emitting display apparatuses 100 and 200.

Referring to FIGS. 1A through 1C, the organic light-emitting display apparatuses 100 and 200 may include a substrate 110 and a display part 10 on the substrate 110, wherein the substrate 110 is divided into a display area DA on which an image is displayed, and a peripheral area PA around the display area DA. An integrated circuit chip 15 may be mounted on the peripheral area PA of the substrate 110.

The display part 10 may include a thin film transistor (TFT), an organic light-emitting device (OLED), a capacitor Cst, etc.

The display part 10 may further include signal lines, such as gate lines for transmitting gate signals and data lines for transmitting data signals. The display part 10 may display an image when a pixel is formed via electrical connection of the thin film transistor TFT, the organic light-emitting display device OLED, etc., wherein the thin film transistor TFT and the organic light-emitting display device OLED are connected to the gate lines and the data lines. A plurality of the pixelx may be provided, and the plurality of pixels may be arranged in various shapes. For example, the pixels may have a stripe arrangement, a pentile arrangement, etc.

Referring to FIG. 1B, the organic light-emitting display apparatus 100 may further include a thin film encapsulation layer 150. The thin film encapsulation layer 150 may prevent external materials, such as water or oxygen, from penetrating through the display part 10, and may be formed to surround an upper surface and/or side surfaces of the display part 10.

In some embodiments, the thin film encapsulation layer 150 may include an inorganic layer and/or an organic layer. The thin film encapsulation layer 150 may be formed by alternately stacking a plurality of inorganic layers and a plurality of organic layers. An uppermost layer of the thin film encapsulation layer 150, which is exposed to the outside, may be formed by using an inorganic layer, in order to prevent water vapor permeation through the organic light-emitting display device OLED.

The inorganic layer may be a single layer or a stack including metal oxide or metal nitride. In detail, the inorganic layer may include at least one of SiNx, $Al_2O_3$, $SiO_2$, and $TiO_2$.

The organic layer may be formed by using a polymer, and may be a single layer or a stack including at least one of polyethyleneterephthalate, polyimide, polycarbonate, epoxy, polyethylene, and polyacrylate.

In other embodiments, the thin film encapsulation layer 150 may have a layer structure including low melting glass, such as SnO.

Referring to FIG. 1C, the organic light-emitting display apparatus 200 may further include a sealing substrate 250. The sealing substrate 250 may prevent external oxygen and water from penetrating through the display part 10. The sealing substrate 250 may include various materials, such as transparent glass, ceramic, transparent plastic, metal, or the like. In some cases, a polarization film or a color filter may further be provided on the sealing substrate 250.

Edges of the substrate 110 and the sealing substrate 250 are coupled to each other via a sealing member 270. The sealing member 270 is arranged to surround the display part 10. The sealing member 270 seals an internal space 25 between the substrate 110 and the sealing substrate 250. The sealing member 270 may prevent oxygen or water from being introduced into the display part 10 and bond the substrate 110 and the sealing substrate 250 to improve the device rigidity.

A moisture absorbent, an internal filler, etc. may be provided in the internal space 25. The internal filler may protect the display part 10 from shocks which may be applied to the display part 10 from the outside.

The organic light-emitting display apparatuses 100 and 200 according to the present embodiments include at least one spacer in the display part 10. In the case of the organic light-emitting display apparatus 100 of FIG. 1B, the spacer may be provided to prevent mask scratches during a mask process. In the case of the organic light-emitting display apparatus 200 of FIG. 1C, the spacer may be used not only to prevent mask scratches during the process, but also to maintain a distance between the substrate 110 and the sealing substrate 250 and increase the device rigidity.

Hereinafter, the embodiments will be described in detail by referring to FIGS. 2 through 3B.

Figure 2:
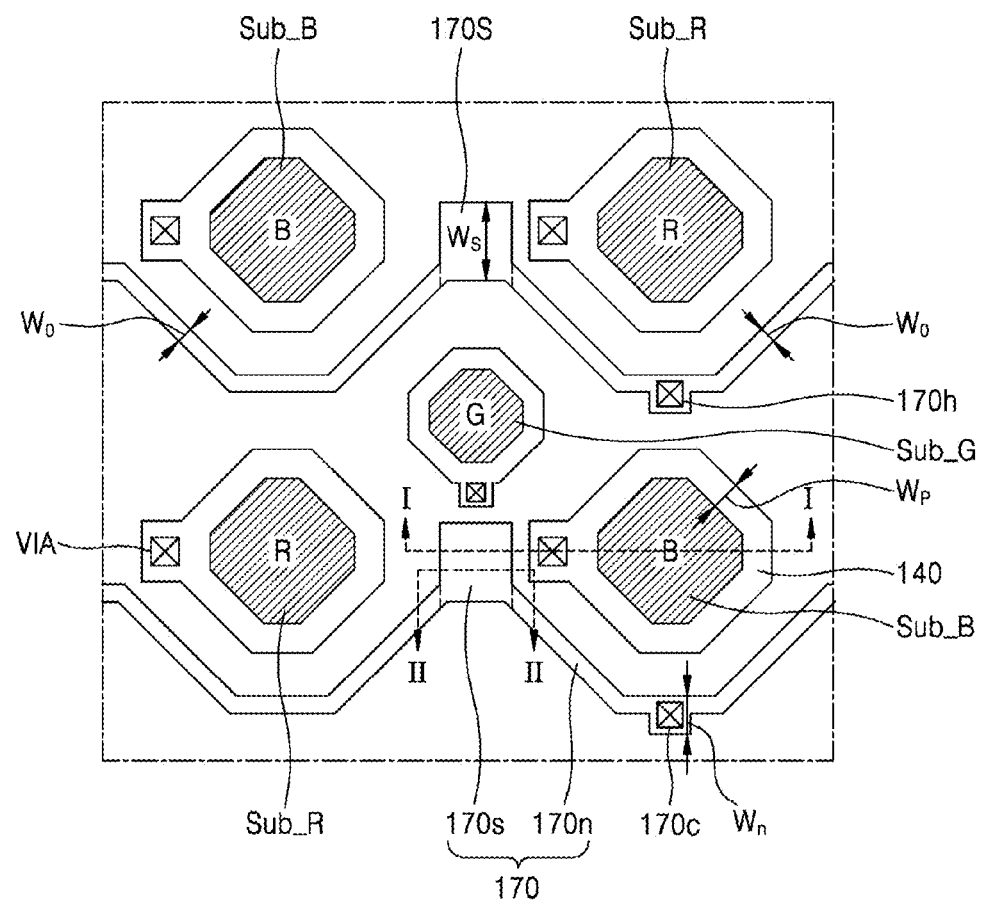
FIG. 2 is an enlarged plan view of a portion of a display area of an organic light-emitting display apparatus according to an embodiment.
Figure 3A:
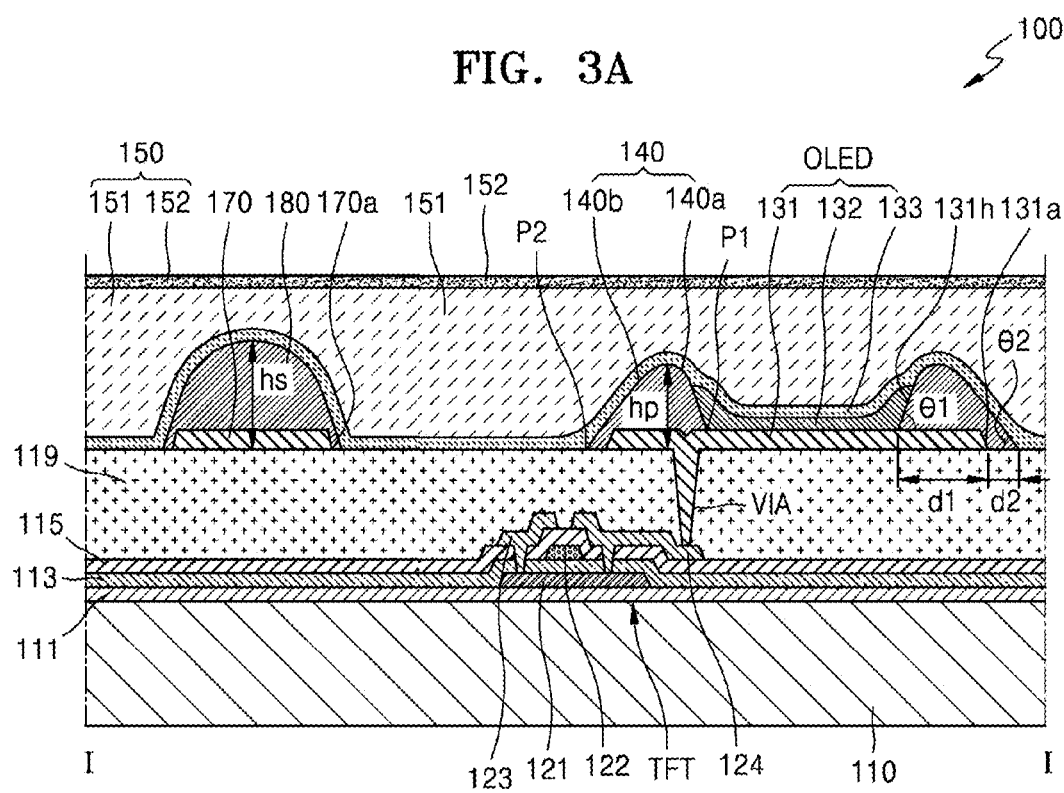
FIG. 3A is a cross-sectional view taken along a line I-I of FIG. 2.
Figure 3B:
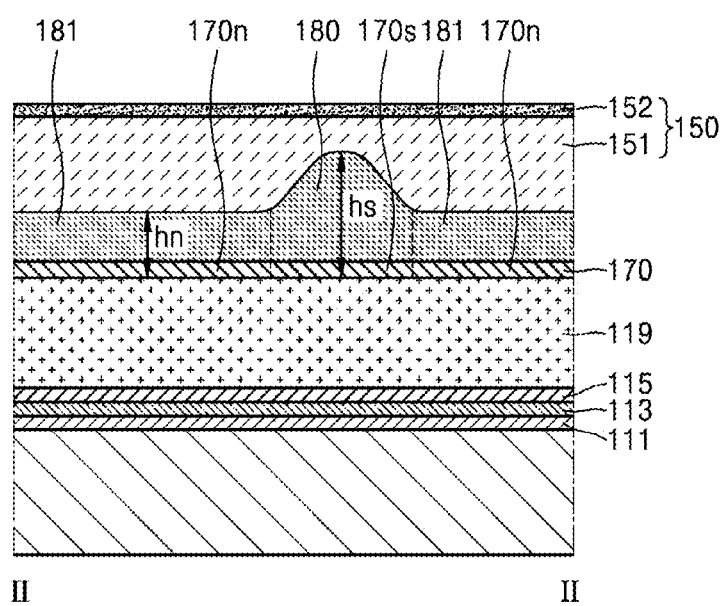
FIG. 3B is a cross-sectional view taken along a line II-II of FIG. 2.

FIG. 2 is an enlarged plan view of a portion of the display area DA of the organic light-emitting display apparatus 100, FIG. 3A is a cross-sectional view taken along a line I-I of FIG. 2, and FIG. 3B is a cross-sectional view taken along a line II-II of FIG. 2.

Referring to FIG. 2, the organic light-emitting display apparatus 100 includes a plurality of sub-pixels including the organic light-emitting device OLED. The plurality of sub-pixels may include a first sub-pixel Sub_R, a second sub-pixel Sub_G, and a third sub-pixel Sub_B.

The first sub-pixel Sub_R may emit light of a red color, the second sub-pixel Sub_G may emit light of a green color, and the third sub-pixel Sub_B may emit light of a blue color. However, the first through third sub-pixels Sub_R, Sub_G, and Sub_B are not limited thereto. The first sub-pixel Sub_R, the second sub-pixel Sub_G, and the third sub-pixel Sub_B may emit light of different colors. For example, at least one of the first sub-pixel Sub_R, the second sub-pixel Sub_G, and the third sub-pixel Sub_B may emit light of a white color, etc.

The first sub-pixel Sub_R, the second sub-pixel Sub_G, and the third sub-pixel Sub_B may have different sizes, and the second sub-pixel Sub_G may have a lesser area than the first sub-pixel Sub_R or the third sub-pixel Sub_B. However, it is not limited thereto, and the first sub-pixel Sub_R, the second sub-pixel Sub_G, and the third sub-pixel Sub_B may have the same or substantially the same sizes. The first sub-pixel Sub_R, the second sub-pixel Sub_G, and the third sub-pixel Sub_B may have polygonal, circular, or oval shapes. The first sub-pixel Sub_R, the second sub-pixel Sub_G, and the third sub-pixel Sub_B may have different shapes from one another.

One of each of the first sub-pixel Sub_R, the second sub-pixel Sub_G, and the third sub-pixel Sub_B may be included to form a pixel, or they may be included in different numeral proportions to form a pixel.

The first sub-pixel Sub_R, the second sub-pixel Sub_G, and the third sub-pixel Sub_B may be arranged to have a stripe shape in which the first sub-pixel Sub_R, the second sub-pixel Sub_G, and the third sub-pixel Sub_B are arranged in series. Alternatively, the first sub-pixel Sub_R, the second sub-pixel Sub_G, and the third sub-pixel Sub_B may be arranged to have a diamond structure or a pentile structure in which the first sub-pixel Sub_R and the third sub-pixel Sub_B are alternately arranged at vertexes of a virtual quadrangle which has the second sub-pixel Sub_G as the center. In addition, the first sub-pixel Sub_R, the second sub-pixel Sub_G, and the third sub-pixel Sub_B may be arranged to have a zig-zag shape, which is one example of various possible shapes.

A wire 170 including a spacer area 170s is arranged among the plurality of sub-pixels. The wire 170 may include, but is not limited to, various wires, such as a data line, a scan line, a power supply line, an initialization power line, etc. The wire 170 may include a contact hole 170c, and the wire 170 may exchange electrical signals with other wires or other devices arranged on different layers, via the contact hole 170c.

The wire 170 may include the spacer area 170s and a non-spacer area 170n. The spacer area 170s is an area in which a spacer 180 is arranged, and the spacer area 170s may include a width Ws that is greater than a width $W_0$ of the non-spacer area 170n in which the spacer 180 is not arranged. Also, the spacer area 170s may have the width Ws that is greater than a width Wp of a pixel-defining layer 140. In this specification, the width of the wire 170 denotes a planar vertical length of a main movement path of an electron, in which the electron moves along the wire 170.

The width Ws of the spacer area 170s may be variable, and may vary according to a shape of the spacer area 170s.

The wire 170 may be patterned like a second insulating material 140''' to be described later, and the non-spacer area 170n of the wire 170 may be covered by a wire-protection layer 181, and the spacer area 170s of the wire 170 may be covered by the spacer 180. The spacer 180 may have a greater height than the wire-protection layer 181. This may be because the spacer area 170s includes the width Ws which is greater than the width $W_0$ of the non-spacer area 170n. More detailed aspects will be described later.

The spacer area 170s may not include the contact hole 170c. When the contact hole 170c is arranged in the spacer area 170s, the spacer 180 may not be formed to be higher than the wire-protection layer 181. Accordingly, the spacer area 170s and the contact hole 170c may be arranged to be spaced apart from each other.

The spacer area 170s may be arranged for each pixel including a set of sub-pixels, or for one from every two or three pixels. Alternatively, a plurality of spacer areas 170s may be included in one pixel.

Referring to FIG. 3A, the organic light-emitting display apparatus 100 according to an embodiment includes the substrate 110, the thin film transistor TFT, a via-insulating layer 119, the organic light-emitting device OLED, the pixel-defining layer 140, the wire 170 including the spacer area 170s, and the spacer 180. The organic light-emitting display apparatus 100 may further include the thin film encapsulation layer 150.

The substrate 110 may include various materials, such as glass, metal, or plastic. According to an embodiment, the substrate 110 may include a flexible substrate. Here, the flexible substrate refers to a substrate which is easily bent, curved, folded, or rolled. The flexible substrate may include ultra-thin glass, metal, or plastic. For example, when plastic is used, the substrate 110 may include polyimide (PI), but is not limited thereto.

The substrate 110 may be divided into the display area DA and the peripheral area PA. In detail, the display area DA may be arranged at a central portion of the substrate 110 and may display an image. A plurality of pixels may be arranged on the display area DA, and the plurality of pixels may include sets of sub-pixels. Each of the sub-pixels includes the organic light-emitting device OLED for realizing an image.

The peripheral area PA may be arranged around the display area DA and may be adjacent to an edge of the substrate 110. When the organic light-emitting display apparatus 100 is sealed by the thin film encapsulation layer 150, a dam portion, a groove, etc. may be arranged on the peripheral area PA to suppress the flow of an organic material, and an integrated circuit chip may be arranged on the peripheral PA to drive the pixels.

A buffer layer 111 may be arranged on the substrate 110 to prevent penetration of impure elements and planarize a surface of the substrate 110. The thin film transistor TFT may be arranged on the display area DA of the buffer layer 111. A barrier layer (not shown) may further be arranged between the substrate 110 and the buffer layer 111, and the buffer layer 111 may be omitted as necessary.

The thin film transistor TFT may function as part of a driving circuit portion for driving the organic light-emitting device OLED. The driving circuit portion may further include a capacitor, a wire, etc. in addition to the thin film transistor TFT.

The thin film transistor TFT may include an active layer 121 arranged on the buffer layer 111, a gate electrode 122 arranged on at least a portion of the active layer 121, a source electrode 123 to which a data signal is applied, and a drain electrode 124 electrically connected to a pixel electrode 131. A gate insulating layer 113 may be arranged between the active layer 121 and the gate electrode 122, and an interlayer insulating layer 115 may be arranged between the gate electrode 122, and the source electrode 123 and the drain electrode 124.

The active layer 121 may include a semiconductor material. For example, the active layer 121 may include amorphous silicon or polycrystalline silicon. However, the present inventive concept is not limited thereto. The active layer 121 according to another embodiment may include an organic semiconductor material or an oxide semiconductor material.

The gate electrode 122 may be connected to a gate wire (not shown) applying an on/off signal to the thin film transistor TFT, and may include a low resistance metal material. For example, the gate electrode 122 may be a single layer or multiple layers including a conductive material, such as Mo, Al, Cu, and/or Ti.

The source electrode 123 and the drain electrode 124 may be a single layer or multiple layers including a conductive material having high conductivity, and may be connected to a source area and a drain area of the active layer 121, respectively.

The thin film transistor TFT according to an embodiment may be a top gate type in which the gate electrode 122 is arranged on the active layer 121. However, the present inventive concept is not limited thereto. According to another embodiment, the thin film transistor TFT may be a bottom gate type in which the gate electrode 122 is arranged below the active layer 121.

The gate insulating layer 113 and the interlayer insulating layer 115 may be a single layer or multiple layers including an inorganic material. For example, the gate insulating layer 113 and the interlayer insulating layer 115 may include $SiO_2$, $SiN_x$, $SiON$, $Al_2O_3$, $TiO_2$, $Ta_2O_5$, $HfO_2$, and/or $ZrO_2$.

The buffer layer 111, the gate insulating layer 113, and the interlayer insulating layer 115 may extend to a portion of the peripheral area PA beyond the display area DA. According to an embodiment, the buffer layer 111, the gate insulting layer 113, and the interlayer insulating layer 115 may be arranged on areas of the substrate 110, except an outermost edge area.

The via-insulating layer 119 may cover the thin film transistor TFT, and remove a step difference due to the thin film transistor TFT, etc. and planarize an upper surface of the thin film transistor TFT. The via-insulating layer 119 may be a single layer or multiple layers including an organic material. However, the present inventive concept is not limited thereto, and the via-insulating layer 119 according to another embodiment may be a combined stack of an inorganic insulating layer and an organic insulating layer.

The organic light-emitting device OLED may be arranged on the via-insulating layer 119. The organic light-emitting device OLED may include the pixel electrode 131 and a counter electrode 133 facing the pixel electrode 131. An organic emission layer 132 may be provided between the pixel electrode 131 and the counter electrode 133.

The pixel electrode 131 may be arranged on the via-insulating layer 119 and may be electrically connected to the thin film transistor TFT via a via-hole VIA included in the via-insulating layer 119. The pixel electrode 131 according to an embodiment is electrically connected to the drain electrode 124. However, the present inventive concept is not limited thereto, and the pixel electrode 131 according to another embodiment may be electrically connected to the source electrode 123.

The pixel electrode 131 may be formed by using a material having a high work function. In the case of a bottom emission type in which an image is displayed toward a bottom portion of the substrate 110, the pixel electrode 131 may include at least one transparent conductive oxide selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

According to another embodiment, in the case of a top emission type in which an image is displayed toward the counter electrode 133, the pixel electrode 131 may further include a metal reflective layer including Ag, Mg, Al, Pt, Pd, Au, Ni, Nd, Ir, Cr, or the like, in addition to the transparent conductive oxide.

The pixel-defining layer 140 may be arranged at an edge of the pixel electrode 131, and the organic emission layer 132 may be arranged on a middle portion of the pixel electrode 131. That is, the organic emission layer 132 may be arranged on an area of the pixel electrode 131, the area not being covered by the pixel-defining layer 140.

The organic emission layer 132 may include a low molecular weight organic material or a high molecular weight organic material, and at least one of a hole injection layer, a hole transport layer, an electron transport layer, and an electron injection layer may further be arranged between the pixel electrode 131 and the counter electrode 133, in addition to the organic emission layer 132. According to an embodiment, various other function layers may further be arranged between the pixel electrode 131 and the counter electrode 133, in addition to the layers described above.

The organic emission layer 132 may be arranged in each organic light-emitting device OLED. In this case, according to a type of the organic emission layer 132 included in the organic light-emitting device OLED, the organic light-emitting device OLED may emit light of a red, green, or blue color. However, the present inventive concept is not limited thereto, and a plurality of organic emission layers 132 may be included in one organic light-emitting device OLED. For example, the plurality of organic emission layers 132 emitting light of red, green, and blue colors may be vertically stacked or combined to emit light of a white color. In this case, a color conversion layer or a color filter may further be provided to convert the emitted light of the white color into a predetermined color. The red, green, and blue colors are examples, and the combination of colors for emitting the light of the white color is not limited thereto.

The counter electrode 133 may be arranged on the organic emission layer 132, and the counter electrode 133 may include various conductive materials. For example, the counter electrode 133 may include transparent conductive metal oxide, such as ITO, IZO, ZnO, $In_2O_3$, IGO, AZO, etc. According to another embodiment, the counter electrode 133 may include a thin film including at least one selected from Li, Ca, LiF/Ca, LiF/Al, Al, Ag, Mg, and Yb. The counter electrode 133 may be formed as a single layer or multiple layers. In the case of the bottom emission type, the counter electrode 133 may be a reflection electrode, and in the case of the top emission type, the counter electrode 133 may be a transparent or a semi-transparent electrode.

The counter electrode 133 may be formed such that a common voltage is applied to all pixels. The counter electrode 133 may extend from an upper surface of the organic emission layer 132 to upper surfaces of the pixel-defining layer 140 and the spacer 180.

The pixel-defining layer 140 may include an opening 131h covering the edge of the pixel electrode 131 and exposing the middle portion of the pixel electrode 131. The pixel-defining layer 140 may include a first inclination portion 140a extending from an area P1 at which an upper surface of the pixel electrode 131 contacts the opening 131h, and a second inclination portion 140b extending from the first inclination portion 140a to an area P2 of an upper surface of the via-insulating layer 119, in an inclination direction that is different from the inclination direction of the first inclination portion 140a.

The first inclination portion 140a may extend from the area P1 at which the upper surface of the pixel electrode 131 contacts the opening 131h toward a direction in which the first inclination portion 140a is distanced from the substrate 110. The second inclination portion 140b may extend from the first inclination portion 140a in a direction toward the substrate 110. Here, the direction in which the first inclination portion 140a is distanced from the substrate 110 and the direction in which the second inclination portion 140b is toward the substrate 110 do not denote directions perpendicular to a principal plane of the substrate 110, but instead, may denote directions inclined with respect to the principal plane of the substrate 110 at a predetermined angle.

The pixel-defining layer 140 may be formed to surround the pixel electrode 131 to expose the upper surface of the pixel electrode 131 and may planarly have a doughnut shape or a polygonal frame shape. The pixel-defining layer 140 may be a photo-sensitive organic layer, and may include, for example, polyimide.

The pixel electrode 131 may be arranged at most areas between the pixel-defining layer 140 and the via-insulating layer 119, and an area at which the pixel-defining layer 140 and the via-insulting layer 119 directly contact each other may be very small compared to the areas at which the pixel-electrode 131 is arranged. That is, an end 131a of the pixel electrode 131 and the area P2 of the upper surface of the via-insulating layer 119 may be adjacent to each other.

The edge of the pixel electrode 131 may extend not only between the via-insulating layer 119 and the first inclination portion 140a of the pixel-defining layer 140, but also between the via-insulating layer 119 and at least a portion of the second inclination portion 140b of the pixel-defining layer 140. That is, the end 131a of the pixel electrode 131 may be between the via-insulating layer 119 and the second inclination portion 140b. A distance d1 between the area P1 of the upper surface of the pixel electrode 131 and the end 131a of the pixel electrode 131, which is covered by the pixel-defining layer 140, may be greater than a distance d2 between the area P2 of the upper surface of the via-insulating layer 119 and the end 131a of the pixel electrode 131.

According to an embodiment, a first angle 81 between the pixel electrode 131 and the first inclination portion 140a may be greater than a second angle 82 between the via-insulating layer 119 and the second inclination portion 140b. The first angle 81 may be less than about 55 degrees, the second angle 82 may be less than about 40 degrees, and a difference between the first angle 81 and the second angle 82 may be equal to or greater than about 5 degrees.

The first inclination portion 140a and the second inclination portion 140b may have different inclinations, depending on areas thereof. The first angle 81 includes inclination angles of the pixel-defining layer 140 at the area P1 of the upper surface of the pixel electrode 131. The second angle 82 includes inclination angles of the pixel-defining layer 140 at the area P2 of the upper surface of the via-insulating layer 119.

Herewith, the first angle 81 and the second angle 82 may be defined by excluding an area of the pixel-defining layer 140, at which the pixel-defining layer 140 extends substantially in parallel to the via-insulating layer 119 and/or the pixel electrode 131 along the upper surface of the via-insulating layer 119 and/or the upper surface of the pixel electrode 131. Being substantially parallel may denote that the angle between the first inclination portion 140a of the pixel-defining layer 140 and the pixel electrode 131 or the angle between the second inclination portion 140b of the pixel-defining layer 140 and the via-insulating layer 119 is less than about 5 degrees.

The wire 170 may be arranged on the same layer as the pixel electrode 131 to be spaced apart from the pixel electrode 131. The wire 170 may be arranged on the via-insulating layer 119. The wire 170 may include various wires, such as a data line, a scan line, a power supply line, an initialization voltage line, an auxiliary wire electrically connected to a wire on a different layer, etc., and is not limited thereto. The wire 170 may include the same material as the pixel electrode 131.

The wire 170 may include the spacer area 170s (refer to FIG. 2), and the spacer 180 is arranged on the spacer area 170s. The spacer 180 may be patterned to correspond to the spacer area 170s and may completely cover the spacer area 170s.

The spacer 180 has a shape protruding in a direction in which the spacer 180 is distanced from the substrate 110. The spacer 180 may support a mask during a mask process in a process of manufacturing the organic light-emitting display apparatus 100. Also, when the organic light-emitting device OLED is sealed by the encapsulation substrate 250 (refer to FIG. 1C), the spacer 180 may support the mask and/or maintain a distance between the substrate 110 and the encapsulation substrate 250. The spacer 180 may completely cover the spacer area 170s of the wire 170 to protect the spacer area 170s. An end 170a of the wire 170 is between the via-insulating layer 119 and the spacer 180. That is, the spacer 180 may cover an upper portion and a side surface of the wire 170 so that the counter electrode 133 which may be formed on the spacer 180 and the wire 170 are not shorted.

A height hs of the spacer 180 may be greater than a height hp of the pixel-defining layer 140. The spacer 180 may be formed to be spaced apart from the pixel-defining layer 140. However, the spacer 180 is not limited thereto. For example, while a top of the spacer 180 and a top of the pixel-defining layer 140 are spaced apart from each other, a bottom of the spacer 180 and a bottom of the pixel-defining layer 140 maybe be connected to each other.

The spacer 180 may include the same material as the pixel-defining layer 140. The spacer 180 may be a photosensitive organic layer, and may include, for example, polyimide. The spacer 180 may be formed on the same layer as the pixel-defining layer 140.

Referring to FIG. 3B, the wire-protection layer 181 may be arranged on the non-spacer area 170n of the wire 170 to be patterned to correspond to the wire 170 and completely cover the non-spacer area 170n. That is, the wire-protection layer 181 may cover the upper portion and the side surface of the wire 170 so that the counter electrode 133 which may be formed on the wire-protection layer 181 and the wire 170 are not shorted.

The spacer 180 and the wire-protection layer 181 are connected to each other, and the height hs of the spacer 180 may be greater than a height hn' of the wire-protection layer 181.

The counter electrode 133 may be arranged on the spacer 180 and the wire-protection layer 181, and the thin film encapsulation layer 150 may be arranged on the counter electrode 133 to seal the organic light-emitting device OLED.

The thin film encapsulation layer 150 may include at least one organic layer 151 and at least one inorganic layer 152. The thin film encapsulation layer 150 may seal the organic light-emitting device OLED so that the organic light-emitting device OLED is not exposed to air or external materials. Also, the thin film encapsulation layer 150 has a very small thickness, and thus, may be used as a sealing portion of a flexible display apparatus that is capable of being bent or folded.

According to an embodiment, the inorganic layer 152 may include oxide, nitride, or oxynitride, such as $SiN_x$, $SiO_2$, or $SiO_xN_y$. The inorganic layer 152 may prevent or reduce the penetration of foreign materials, such as water or oxygen, into the organic light-emitting device OLED, and may extend from the display area DA to the peripheral area PA.

According to an embodiment, a function layer (not shown) and a protection layer (not shown) may further be arranged between the counter electrode 133 and the thin film encapsulation layer 150. The function layer may include a capping layer (not shown) and/or an LiF layer (not shown) for improving the light efficiency by controlling a refractive index of visible light emitted from the organic light-emitting device OLED, and the protection layer may include an inorganic material, such as aluminum oxide.

Figure 4A:
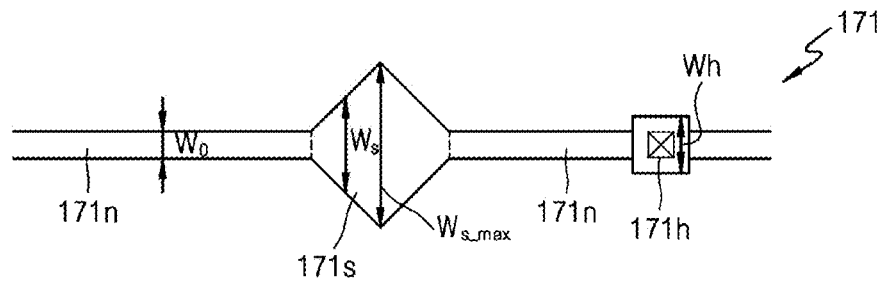
FIGS. 4A, 4B, and 4C are schematic plan views of shapes of a wire which may be implemented in an organic light-emitting display apparatus, according to embodiments.
Figure 4B:
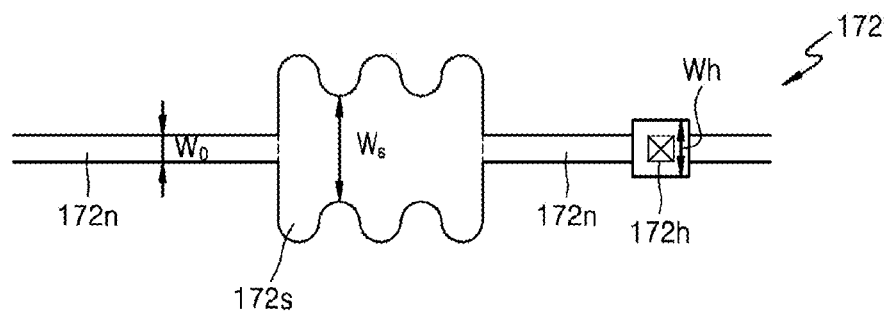
Figure 4C:
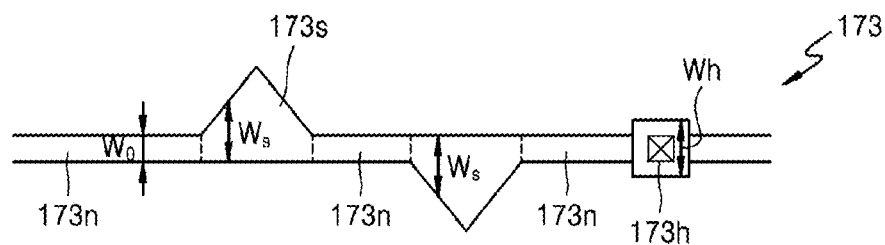

FIGS. 4A through 4C are schematic plan views of shapes of wires 171, 172, and 173 which may be implemented in the organic light-emitting display apparatus 100.

Spacer areas 171s, 172s, and 173s of the wires 171, 172, and 173 may have various shapes. As illustrated in FIG. 4B, the spacer area 172s may have curved edges. Alternatively, the spacer areas 171s, 172s, and 173s may have amorphous shapes. The spacer areas 171s, 172s, and 173s may have various shapes depending on the spatial arrangement with respect to peripheral pixels.

The wires 171, 172, and 173 may include the spacer areas 171s, 172s, and 173s, and non-spacer areas 171n, 172n, and 173n. The spacer areas 171s, 172s, and 173s may have widths Ws that are greater than widths $W_0$ of the non-spacer areas 171n, 172n, and 173n. The widths Ws of the spacer areas 171s, 172s, and 173s may be variable.

The wires 171, 172, and 173 may include contact holes 171h, 172h, and 173h, which may be spaced apart from the spacer areas 171s, 172s, and 173s. Widths Wh of the wires 171, 172, and 173 in which the contact holes 171h, 172h, and 173h are arranged may be greater than the widths $W_0$ of the non-spacer areas 171n, 172n, and 173n. However, it is not limited thereto. The widths Wh of the wires 171, 172, and 173 in which the contact holes 171h, 172h, and 173h are arranged may be substantially the same as the widths $W_0$ of the non-spacer areas 171n, 172n, and 173n. In some embodiments, the widths Wh of the wires 171, 172, and 173 in which the contact holes 171h, 172h, and 173h are arranged may be less than a maximum width Ws_max of the spacer areas 171s, 172s, and 173s.

FIGS. 5A through 5H are cross-sectional views for sequentially describing a method of manufacturing the organic light-emitting display apparatus 100 of FIG. 3A.

Figure 5A:
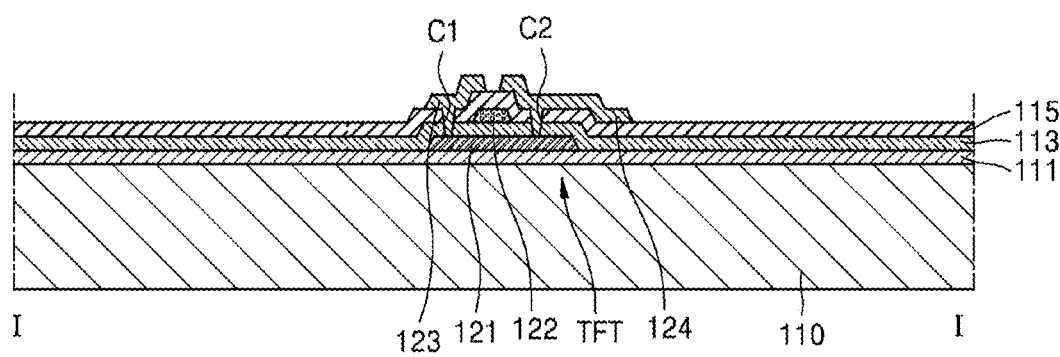
FIGS. 5A, 5B, 5C, 5D, 5E, 5F, 5G, and 5H are cross-sectional views for sequentially describing a method of manufacturing the organic light-emitting display apparatus of FIG. 3A.

Referring to FIG. 5A, the thin film transistor TFT may be formed on the substrate 110 including the display area DA (FIG. 1A) on which an image is displayed.

In detail, the buffer layer 111 may be formed on the substrate 110, and then, a semiconductor material may be patterned on the buffer layer 111 to form the active layer 121. After the active layer 121 is formed, the gate insulating layer 113 may be formed on the active layer 121. Thereafter, a conductive material may be patterned on the gate insulating layer 113 to form the gate electrode 122. The gate electrode 122 may planarly overlap at least a portion of the active layer 121.

After the gate electrode 122 is formed, the interlayer insulating layer 115 may be formed to cover the gate electrode 122, and at least two contact holes C1 and C2 exposing the active layer 121 may be formed by simultaneously etching the interlayer insulating layer 115 and the gate insulating layer 113.

According to an embodiment, the active layer 121 may include polycrystalline silicon, and areas of the active layer 121, which are exposed via the contact holes C1 and C2, may be the source area and the drain area of the active layer 121. The source area and the drain area may be doped polycrystalline silicon areas, that is, conductor areas. According to an embodiment, doping may be performed after the gate electrode 122 is formed.

The buffer layer 111, the gate insulating layer 113, and the interlayer insulating layer 115 may extend from the display area DA to the peripheral area PA, and the buffer layer 111, the gate insulating layer 113, and the interlayer insulating layer 115 may be removed such that an edge of the substrate 110, which is in the peripheral area PA, is exposed. The removal of the buffer layer 111, the gate insulting layer 113, and the interlayer insulating layer 115 for exposing the substrate 110 in the peripheral area PA may be simultaneously performed with the formation of the contact holes C1 and C2.

After the contact holes C1 and C2 are formed, a conductive material may be formed and patterned on the interlayer insulating layer 115 to form the source electrode 123 and the drain electrode 124 respectively connected to the source area and the drain area of the active layer 121.

Figure 5B:
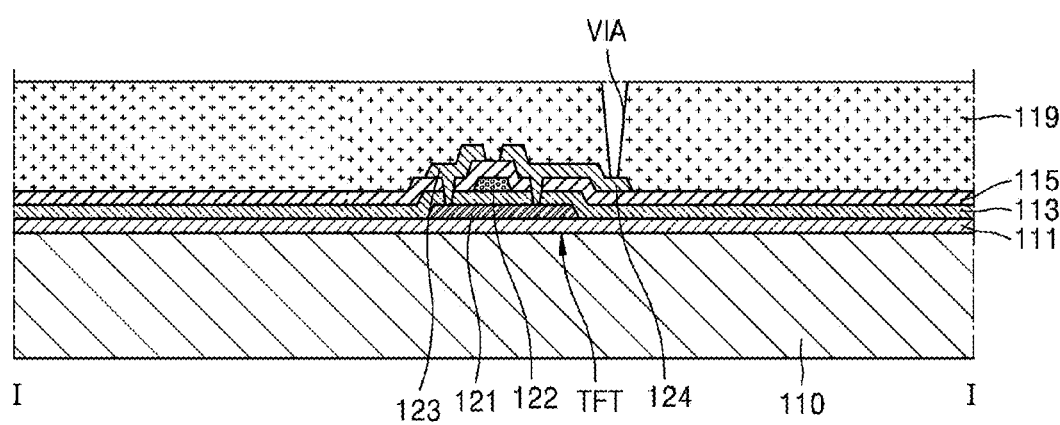

Referring to FIG. 5B, after a first insulating material 119' covering the thin film transistor TFT is formed on the substrate 110, the first insulating material 119' may be patterned to form the via-insulating layer 119. The via-insulating layer 119 may be a single layer or multiple layers including an organic material, and may include a via-hole VIA.

Figure 5C:
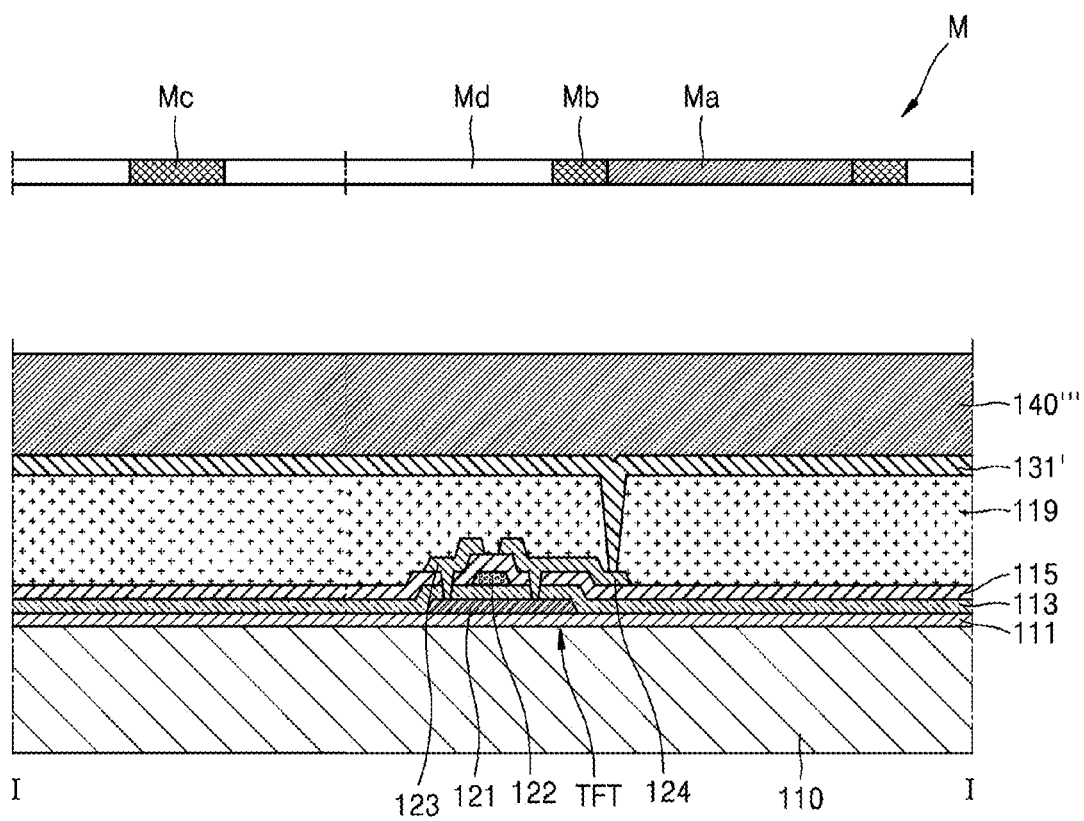

Referring to FIG. 5C, a conductive material 131' and a second insulating material 140''' may be formed on the via-insulating layer 119. The conductive material 131' may be at least one transparent conductive oxide selected from the group consisting of ITO, IZO, ZnO, $In_2O_3$, IGO, and AZO. The conductive material 131' may further include a metal reflective layer, such as Ag, Mg, Al, Pt, Pd, Au, Ni, Nd, Ir, and Cr, in addition to the transparent conductive oxide. The second insulating material 140''' may include a photosensitive organic material, such as polyimide.

Light may be irradiated onto the second insulating material 140''' by using a half-tone mask M, and the half-tone mask M may include a transmissive portion Md, light-shielding portions Mb and Mc, and a semi-transmissive portion Ma. The transmissive portion Md, the light-shielding portions Mb and Mc, and the semi-transmissive portion Ma may respectively correspond to an area from which the conductive material 131' is to be completely removed, an area on which the second insulating material 140''' is to finally remain, and an area at which a portion of the second insulating material 140''' is to remain and to be removed by ashing.

Figure 5D:
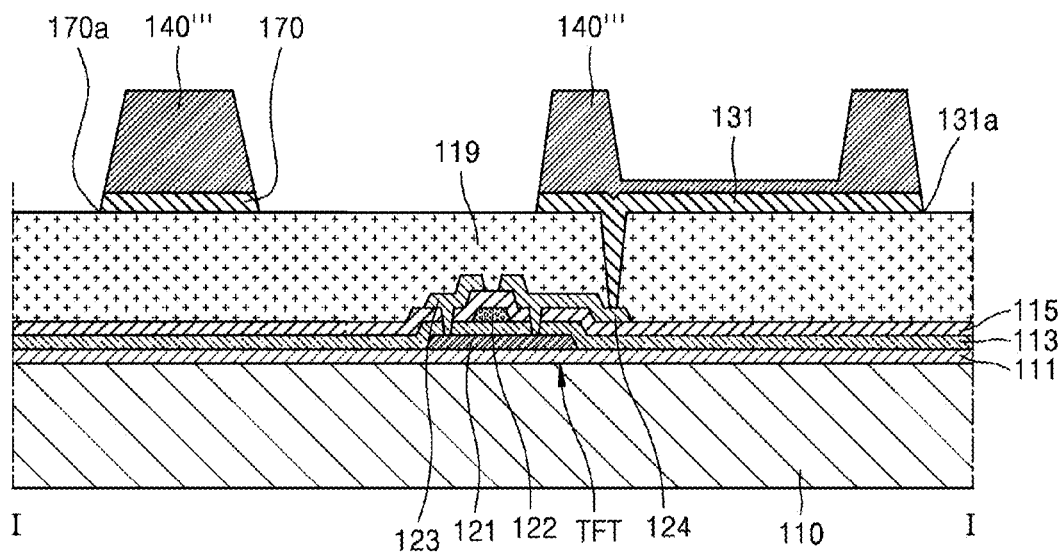

Referring to FIG. 5D, the second insulating material 140''' may be completely removed by irradiating light thereon via the transmissive portion Md, and then, the second insulating material 140''' may be partially removed by irradiating light thereon via the semi-transmissive portion Ma. Thereafter, the conductive material 131' exposed by completely removing the second insulating material 140''' may be etched to form the pixel electrode 131 and the wire 170.

Via the process described above, the pixel electrode 131, the wire 170, and the second insulating material 140''' arranged and patterned on the pixel electrode 131 and the wire 170 may remain.

Figure 5E:
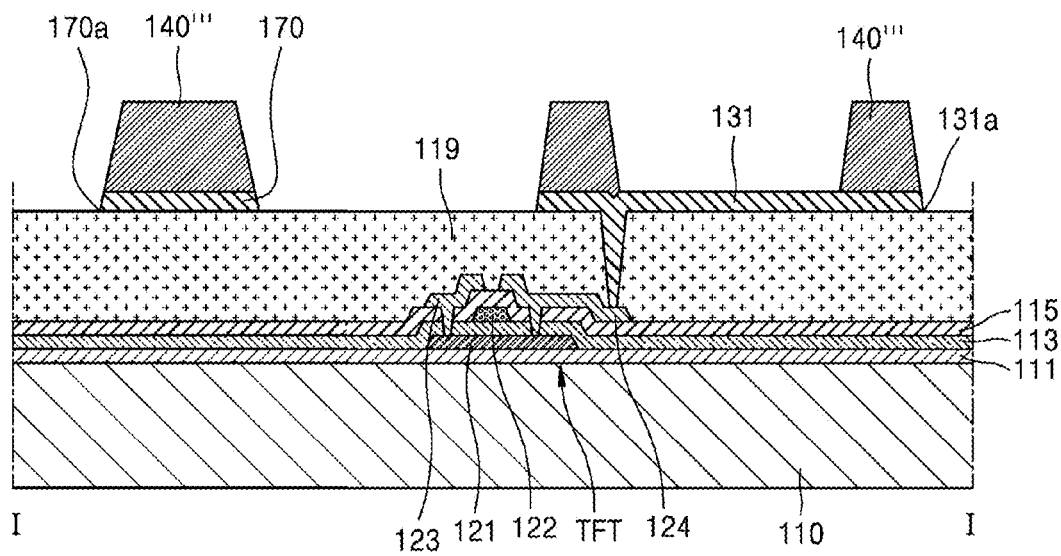

Referring to FIG. 5E, the patterned second insulating material 140''' may be partially removed via ashing. That is, the patterned second insulting material 140''' may have a reduced height due to ashing. The second insulating material 140''' partially remaining by being irradiated with light via the semi-transmissive portion Ma may be completely removed via ashing so as to expose a central portion of the pixel electrode 131. FIG. 5E illustrates the second insulating material 140''' after ashing, wherein the end 131*a* of the pixel electrode 131 and the end 170*a* of the wire 170 may not be covered by the second insulating material 140'''.

Figure 5F:
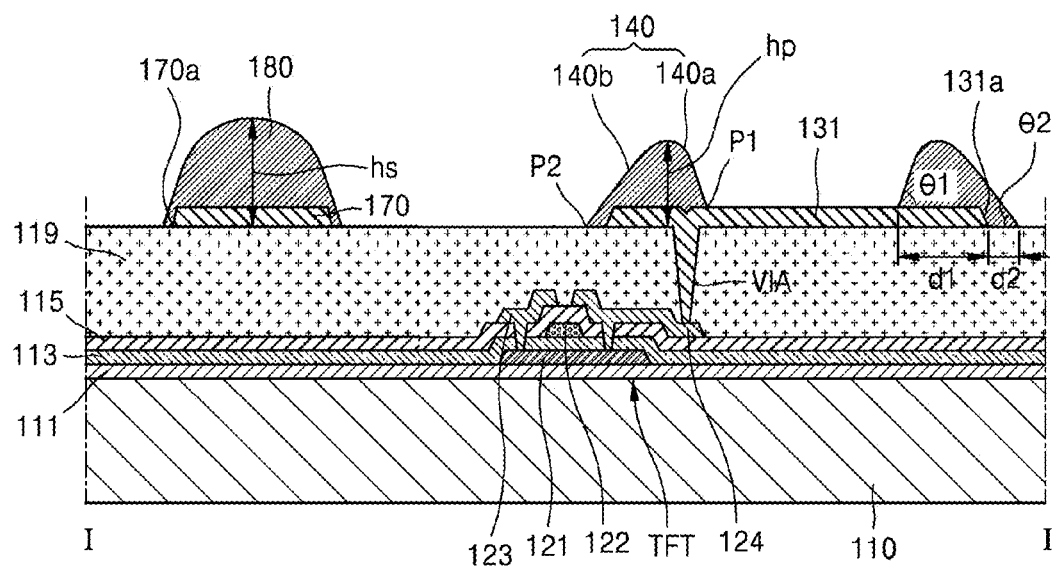

Referring to FIG. 5F, heat may be applied to the second insulating material 140''' after ashing, in order to reflow the second insulating material 140''' to form the pixel-defining layer 140 which covers an edge of the pixel electrode 131. That is, the second insulating material 140''' may leak through due to the thermal reflow to cover the end 131*a* of the pixel electrode 131. When the end 131*a* of the pixel electrode 131 is exposed, the pixel electrode 131 may be shorted with respect to the counter electrode 133 (FIG. 3G) formed by a sequential process. To prevent the pixel electrode 131 from being shorted with respect to the counter electrode 133, the reflow process may be performed so that the pixel-defining layer 1430 may cover the end 131*a* of the pixel electrode 131.

The second insulating material 140''' remaining on the wire 170 after ashing may also leak through due to the reflow, and thus, the spacer 180 and the wire-protection layer 181 (refer to FIG. 3B) completely covering the wire 170 may be formed. That is, the second insulating material 140''' may leak through due to the thermal reflow to cover the end 170*a* of the wire 170. When the end 170*a* of the wire 170 is exposed, the wire 170 may be shorted with respect to the counter electrode 133 (FIG. 5G) formed by a sequential process. To prevent the wire 170 from being shorted with respect to the counter electrode 133, the reflow process may be performed so that the spacer 180 may cover the end 170*a* of the wire 170.

According to a volume per unit length of the second insulating material 140' after ashing, a degree at which the second insulating material 140' leaks through may vary. That is, according to a shape of the patterned second insulating material 140', the reflow degree may vary, and thus, a height difference between the spacer 180 and the pixel-defining layer 140 may be generated.

According to a shape of the wire 170, a volume per unit length of the spacer 180 may be greater than a volume per unit length of the pixel-defining layer 140. Accordingly, the height hs of the spacer 180 may be greater than the height hp of the pixel-defining layer 140. Likewise, the height hs of the spacer 180 may be greater than the height hn of the wire-protection layer 181 (refer to FIG. 3B).

That is, according to the method of manufacturing the organic light-emitting display apparatus 100 according to an embodiment, the pixel electrode 131, the wire 170, the pixel defining layer 140, and the spacer 180 may be formed by using one mask. Thus, the manufacturing costs may be reduced and the process may become less complex.

Figure 5G:
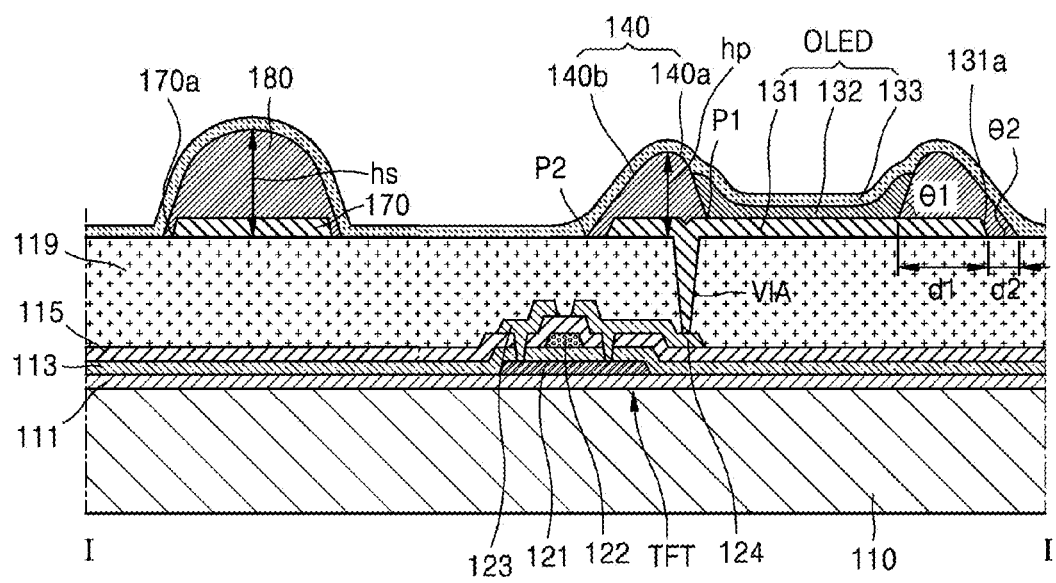

Referring to FIG. 5G, after the organic emission layer 132 is formed on an area of the pixel electrode 131, which is not covered by the pixel-defining layer 140, the counter electrode 133 may be formed on the organic emission layer 132 to form the organic light-emitting device OLED. The counter electrode 133 may extend to an upper portion of the spacer 180.

The counter electrode 133 may be formed by a sputtering process, a vapor deposition process, a chemical vapor deposition (CVD) process, a pulse laser deposition process, a printing process, an atomic layer deposition (ALD) process, or the like. In some embodiments, the counter electrode 133 may be formed such that a common voltage is applied to all pixels.

Figure 5H:
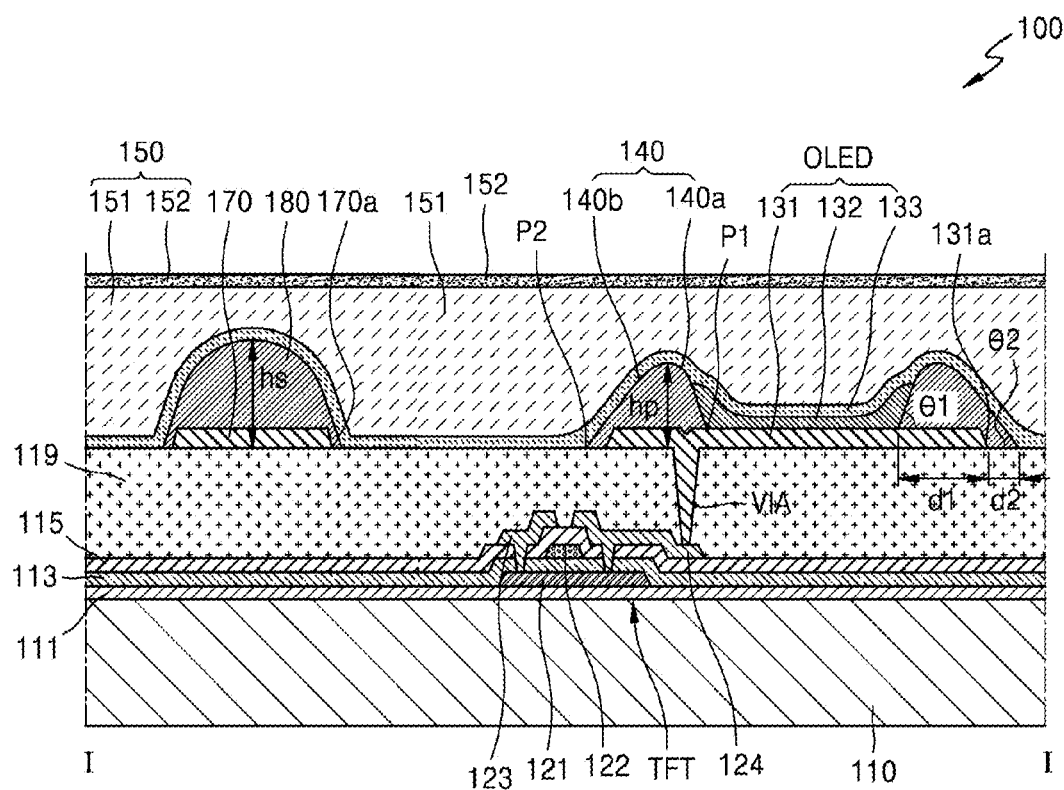

Referring to FIG. 5H, the thin film encapsulation layer 150 including at least one inorganic layer 152 and at least one organic layer 151 may be formed on the counter electrode 133.

The inorganic layer 152 may include at least one material selected from AlOx, SiNx, SiOx, SiON, ITO, AZO, ZnO, and ZrO. The inorganic layer 152 may be deposited via various deposition methods, such as CVD, ALD, sputtering, etc.

The organic layer 151 may include any one of epoxy, acrylate, silicon, and polyacrylate. The organic layer 151 may be coated or deposited via flash evaporation, inkjet printing, slot die coating, or the like.

Figure 6:
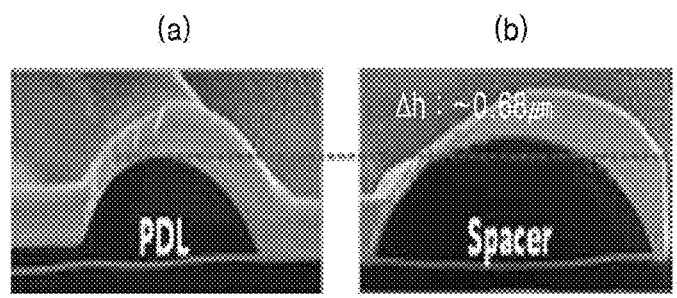
FIG. 6 shows focused ion beam (FIB) images of sections of a pixel-defining layer and a spacer which are manufactured according to an embodiment.

FIG. 6 shows focused ion beam (FIB) images (a) and (b) of sections of the pixel-defining layer 140 and the spacer 180 manufactured according to an embodiment.

The pixel-defining layer 140 may be patterned to have a volume per unit length that is less than a volume per unit length of the spacer 180, and the pixel-defining layer 140 and the spacer 180 may be formed by simultaneously performing reflow on the pixel-defining layer 140 and the spacer 180. It is shown that a height of the spacer 180 is greater than a height of the pixel-defining layer 140. A height difference between the spacer 180 and the pixel-defining layer 140 may be controlled according to a shape, a size, etc. of the pattern.

As described above, according to the one or more of the above embodiments, according to the organic light-emitting display apparatuses 100 and 200 and the method of manufacturing the organic light-emitting display apparatuses 100 and 200, the number of masks may be reduced, and thus, the manufacturing costs may be reduced and the process may become less complex.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing an organic light-emitting display apparatus, the method comprising:
   providing a substrate on which a display area is defined, wherein the display area is configured to display an image;
   forming a thin film transistor on the display area of the substrate;
   forming a via-insulating layer covering the thin film transistor;
   forming a conductive material on the via-insulating layer;
   forming a second insulating material on the conductive material;
   exposing the conductive material by irradiating light onto the second insulating material and removing a portion of the second insulating material;
   forming a pixel electrode and a wire that is spaced apart from the pixel electrode by etching an exposed portion of the conductive material;
   forming a pixel-defining layer covering an edge area of the pixel electrode, and a spacer covering the wire, by reflowing the second insulating material;
   forming an organic emission layer on the pixel electrode; and
   forming a counter electrode on the organic emission layer;
   wherein a height between the via-insulating layer and a top of the spacer is greater than a height between the via-insulating layer and a top of the pixel defining layer.

2. The method of claim 1, wherein the wire comprises a spacer area on which the spacer is formed, and a non-spacer area, and the wire in the spacer area has a greater width than the wire in the non-spacer area.

3. The method of claim 1, wherein the wire comprise a contact hole, and the contact hole is spaced apart from the spacer area.

4. The method of claim 1, further comprising:
   forming a wire-protection layer completely covering the non-spacer area of the wire and patterned to correspond to the non-spacer area.

5. The method of claim 1, further comprising:
   irradiating light onto the second insulating material,
   wherein the irradiating light onto the second insulating material comprises irradiating light onto the second insulating material by using a half-tone mask comprising a transmissive portion, a semi-transmissive portion, and a light shielding portion.

6. The method of claim 1, further comprising, after forming the counter electrode, forming a thin film encapsulation layer comprising at least one inorganic layer and at least one organic layer.

* * * * *